(12) United States Patent
Olson et al.

(10) Patent No.: US 8,097,866 B2
(45) Date of Patent: Jan. 17, 2012

(54) APPARATUS FOR MEASURING BEAM CHARACTERISTICS AND A METHOD THEREOF

(75) Inventors: Joseph C. Olson, Beverly, MA (US); Atul Gupta, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 440 days.

(21) Appl. No.: 12/031,643

(22) Filed: Feb. 14, 2008

(65) Prior Publication Data
US 2009/0206273 A1 Aug. 20, 2009

(51) Int. Cl.
*G01T 1/00* (2006.01)
(52) U.S. Cl. ............. 250/492.21; 250/491.1; 250/492.2; 250/492.3; 250/397; 250/396 R
(58) Field of Classification Search ............... 250/491.1, 250/492.2, 492.21, 492.3, 397, 396 R
See application file for complete search history.

(56) References Cited

U.S. PATENT DOCUMENTS

| | | | |
|---|---|---|---|
| 4,234,797 A * | 11/1980 | Ryding ................. | 250/492.3 |
| 4,751,393 A * | 6/1988 | Corey et al. ............. | 250/492.2 |
| 4,786,814 A * | 11/1988 | Kolondra et al. ......... | 250/492.2 |
| 4,943,728 A | 7/1990 | Dykstra et al. | |
| 5,144,147 A * | 9/1992 | Shiozaki et al. .......... | 250/492.2 |
| 5,554,926 A | 9/1996 | Elmer et al. | |
| 5,583,427 A | 12/1996 | Teruya et al. | |
| 5,744,812 A * | 4/1998 | Oh et al. ................. | 250/492.21 |
| 5,757,018 A * | 5/1998 | Mack et al. ............. | 250/492.21 |
| 5,959,302 A | 9/1999 | Charpak | |
| 6,300,755 B1 | 10/2001 | Elmer et al. | |
| 6,690,022 B2 | 2/2004 | Larsen et al. | |
| 6,723,998 B2 * | 4/2004 | Bisson et al. ............. | 250/397 |
| 6,828,572 B2 | 12/2004 | Reece et al. | |
| 6,852,984 B2 | 2/2005 | Krueger | |
| 6,858,854 B2 | 2/2005 | Keum et al. | |
| 6,903,348 B2 | 6/2005 | Jang et al. | |
| 6,956,223 B2 | 10/2005 | Smick et al. | |
| 7,145,150 B2 | 12/2006 | Chugg | |
| 7,338,683 B2 | 3/2008 | Selvamanickam et al. | |
| 7,385,207 B2 * | 6/2008 | Yoon ..................... | 250/492.21 |
| 7,435,977 B2 * | 10/2008 | Freer et al. ............. | 250/492.21 |
| 2003/0094583 A1 * | 5/2003 | Jang et al. .............. | 250/492.21 |
| 2003/0197132 A1 * | 10/2003 | Keum et al. ............. | 250/492.21 |
| 2004/0262532 A1 * | 12/2004 | Krueger ................. | 250/397 |
| 2004/0262533 A1 * | 12/2004 | Krueger ................. | 250/397 |
| 2005/0191409 A1 | 9/2005 | Murrell et al. | |
| 2005/0247889 A1 * | 11/2005 | Yoon ..................... | 250/491.1 |
| 2006/0033046 A1 * | 2/2006 | Ferrara et al. ............ | 250/492.21 |

(Continued)

FOREIGN PATENT DOCUMENTS
JP 63216254 A * 9/1988
(Continued)

*Primary Examiner* — Robert Kim
*Assistant Examiner* — Michael Logie

(57) ABSTRACT

An apparatus and a method for detecting particle beam characteristics are disclosed. In one embodiment, the apparatus may have a body including a first end and second end and at least one detector between the first and second ends. The apparatus may have a transparent state where a portion of the particles entering the apparatus may pass through the apparatus. The apparatus may also have a minimum transparency state where substantially all of the particles entering the apparatus may be prevented from passing through the apparatus and detected. Different transparency state may be achieved by rotating the apparatus or the detector contained therein. With the apparatus, it is possible to detect the beam properties such as the beam intensity, angle, parallelism, and a distribution of the particles in a particle beam.

20 Claims, 9 Drawing Sheets

U.S. PATENT DOCUMENTS

| | | | |
|---|---|---|---|
| 2006/0219886 A1* | 10/2006 | Hwang | 250/251 |
| 2007/0045569 A1 | 3/2007 | Walther et al. | |
| 2007/0075260 A1* | 4/2007 | Park | 250/397 |
| 2007/0120073 A1* | 5/2007 | Peng | 250/492.21 |
| 2007/0210248 A1 | 9/2007 | Koo et al. | |
| 2008/0169435 A1* | 7/2008 | Sakase et al. | 250/492.21 |

FOREIGN PATENT DOCUMENTS

| | | | |
|---|---|---|---|
| JP | 2000-294180 | * | 10/2000 |
| JP | 2000294180 | | 10/2000 |

* cited by examiner

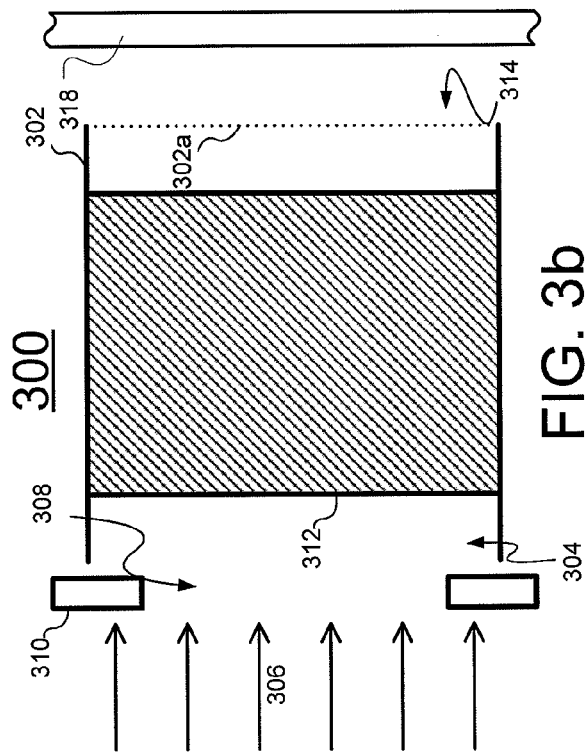
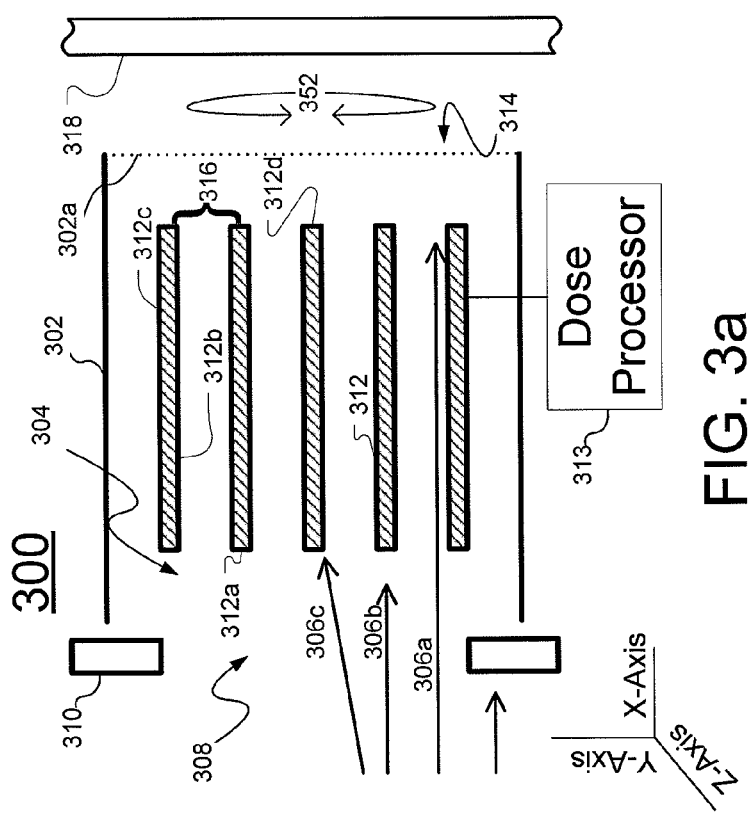
FIG. 3b
FIG. 3a

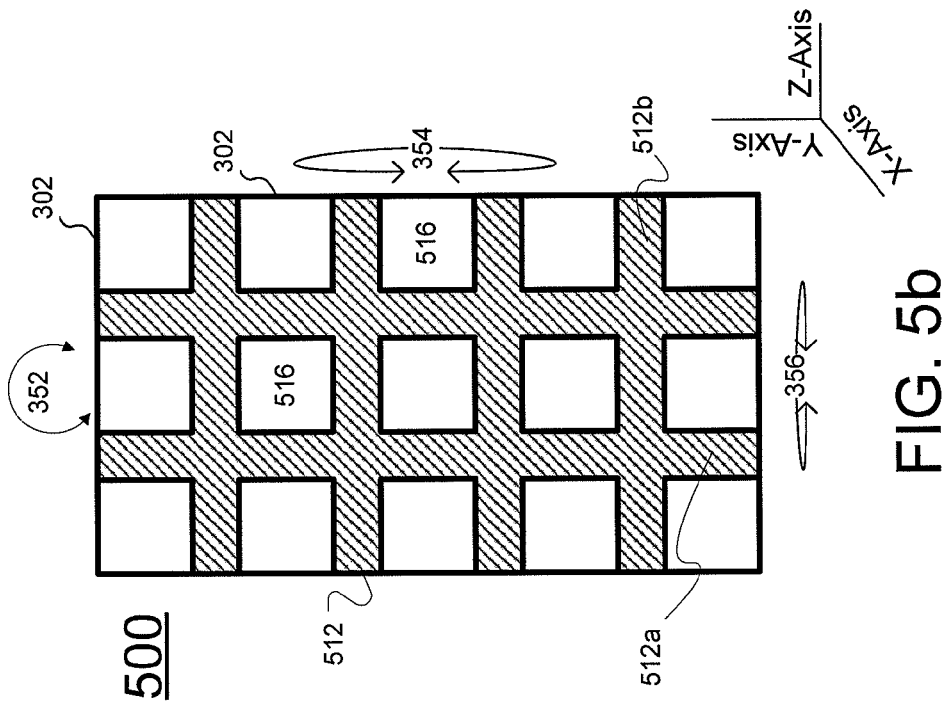
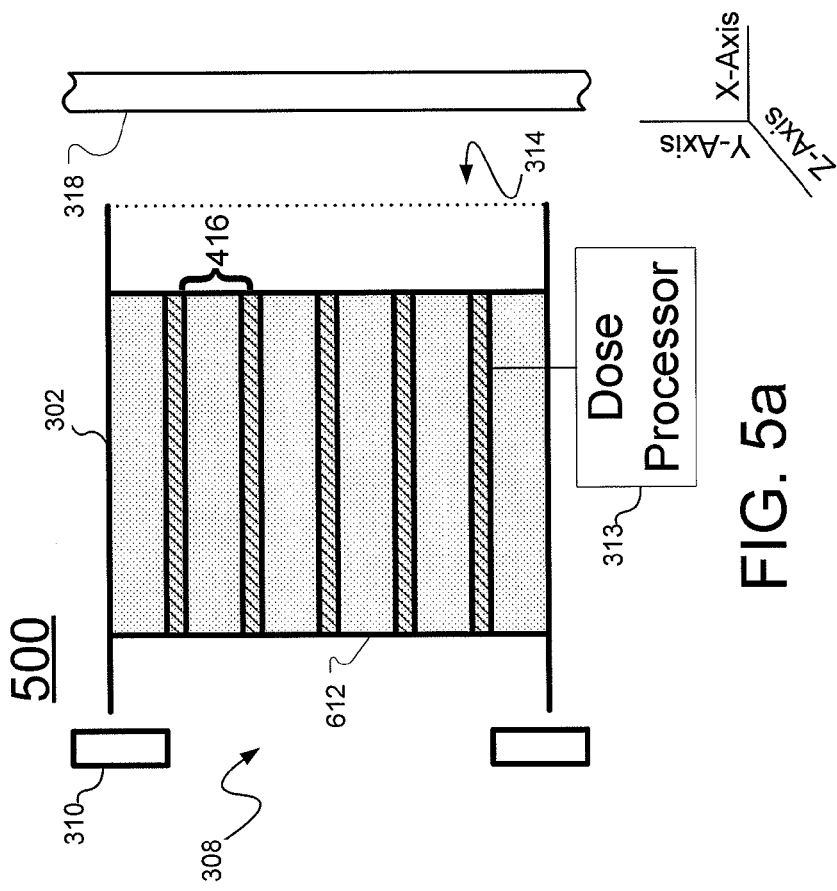
FIG. 5b
FIG. 5a

APPARATUS FOR MEASURING BEAM CHARACTERISTICS AND A METHOD THEREOF

FIELD

The present disclosure is related to particle processing, more particularly to an apparatus and a method for measuring beam characteristics.

BACKGROUND

Ion implantation is a property altering process performed in manufacturing, among others, semiconductor devices. Among other tools, a beam-line ion implanter may be used. A block diagram of a conventional ion implanter is shown in FIG. 1. The conventional ion implanter may comprise an ion source 102 that may be biased by a power supply 101. The ion source 102 is typically contained in a vacuum chamber known as a source housing (not shown). The ion implanter system 100 may also comprise a series of beam-line components through which ions 10 pass. The series of beam-line components may include, for example, extraction electrodes 104, a 90° magnet analyzer 106, a first deceleration (D1) stage 108, a 70° magnet collimator 110, and a second deceleration (D2) stage 112. Much like a series of optical lenses that manipulate a light beam, the beam-line components can manipulate and focus the ion beam 10 before steering it towards a target workpiece. During ion implantation, a wafer 114 is typically mounted on a platen 116 that can be moved in one or more dimensions (e.g., translate, rotate, and tilt) by an apparatus, sometimes referred to as a "roplat" (not shown).

In operation, the ions are generated in the ion source 102 and extracted by the extraction electrodes 104. The extracted ions 10 travel in a beam-like state along the beam-line components and implanted to the wafer 114.

As noted above, the ion implantation process is a property altering process. For example, ions such as boron and phosphorous ions may be implanted to portions of a silicon wafer to change electrical properties of the wafer. A field effect transistor is an example of a device that may utilize the above implantation. As known in the art, such implantation may enhance the electrical property of the wafer.

The ion implantation process may also be performed to enhance other properties, such as optical and mechanical properties. For example, the ion implantation process may be performed to destroy crystallinity of a crystal substrate, thereby limiting crystalline slips and enhancing mechanical toughness of the substrate. In addition, the process may be performed to reduce diffusion rate or mobility rate of ions implanted within the substrate.

As the properties of the final product may depend on the parameters of the property altering ion implantation process, it may be desirable to control the parameters of the implantation process. One of such parameters may be the angle by which the ions are directed to the wafer. The ion angle may be important as the angle may determine the size and/or location of the implanted region. In addition, the ion angle may influence the depth of the implantation. For example, ions that are directed at an angle perpendicular to the wafer may be implanted at a greater depth than ions that are directed at other angles. If the ions are directed toward the substrate in multiple, non-uniform angles, ions may be implanted at different depths and the implantation may be non-uniform. Further, the angle of the ions may be an important parameter as the three dimensional device substrates may include surfaces oriented at different angles (e.g. vertical and horizontal surfaces). Ions directed toward the substrate at one angle may reach one surface, but may not reach another surface.

Another important parameter may be the ion dose. It may be desirable to control the ion dose such that the processed product may meet the required electrical property. Controlling the ion dose may also be important to produce uniform devices. For example, it may be desirable to control the ion dose such that several devices manufactured from a single semiconductor substrate may have uniform properties. In addition, controlling the ion dose may be desirable, as devices manufactured from different substrates may have uniform properties.

One of the tools used to measure and control the ion dose is a Faraday cup 200 shown in FIG. 2. A conventional Faraday cup 200 may comprise a Faraday cup body 22, defining an empty region 24. The Faraday cup body 22 includes an end wall 22a and side walls 22b. The Faraday cup 20 may further include a housing 26 that encloses the Faraday cup body 22. The housing 26 may include a front plate 28 having an opening that defines an entrance aperture 30 of the chamber 24. The Faraday cup body 22 may be connected to a dose processor.

The Faraday cup body 22 may receive the ions and generates an electrical current representative of the ion dose. The current is then input to the dose processor. By measuring the dose, the components of the ion implanters may be adjusted to produce ions conforming to a desired specification.

Although the Faraday cup 20 illustrated in FIG. 2 is capable of detecting the ion dose, the cup 20 is incapable of measuring other characteristics of the beam. Therefore, there is a need for a new apparatus.

SUMMARY OF THE DISCLOSURE

An apparatus and a method for detecting particle beam characteristics are disclosed. In a particular embodiment, the method for detecting particle beam characteristics may be realized by an apparatus comprising a body that includes a side wall that defines a cavity, a first end, and an entrance aperture proximate to the first end for receiving a plurality of particles and being in communication with the cavity; and at least one detector disposed in the cavity and being configured to detect at least a portion of the particles.

In another particular embodiment, the method for detecting particle beam characteristics may be realized by a substrate processing system. The substrate processing system may comprise a particle generator configured to generate a plurality of particles; a substrate; and a particle beam detecting apparatus being configured to receive at least one particle of the plurality of particles, being configured to detect the at least one particle, and having at least one degree of rotational freedom.

In another particular embodiment, the method for detecting particle beam characteristics may include generating the particle beam and directing the particle beam along a beam path; disposing a particle beam detecting system on the beam path to receive at least a portion of the generated particles, the particle beam detector comprising at least one detector; rotating the particle beam detecting system; and detecting at least a portion of the received particles.

In another particular embodiment, the method for detecting particle beam characteristics may be realized by another particle processing system. The particle processing system may comprise a particle generator configured to generate a plurality of particles; and a particle detector being configured to receive at least a portion of the generated particles, being configured to detect at least a portion of the received particles, and having a variable transparency state to collect at least a portion of the received particles and to control a number of the received particles passing through the particle detector.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like features are referenced with like numerals. These figures should not be construed as limiting the present disclosure, but are intended to be exemplary only.

FIGS. 3a and 3b are block diagrams illustrating an apparatus for measuring particle beam characteristics according to one embodiment of the present disclosure.

FIGS. 5a and 5b are block diagrams illustrating an apparatus for measuring particle beam characteristics according to another embodiment of the present disclosure.

DESCRIPTION

Figure 1:
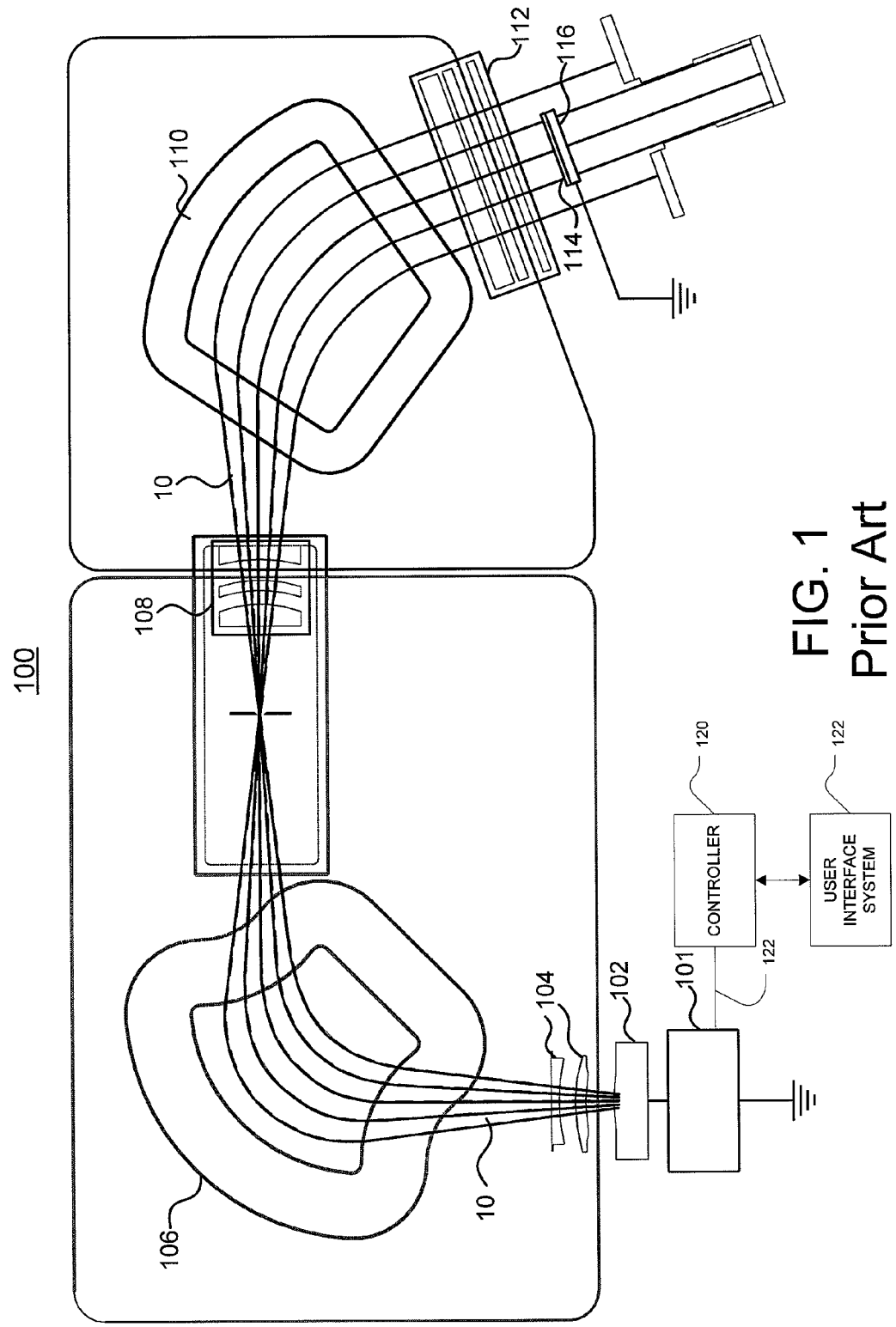
FIG. 1 is a block diagram illustrating a conventional ion implantation system.
Figure 2:
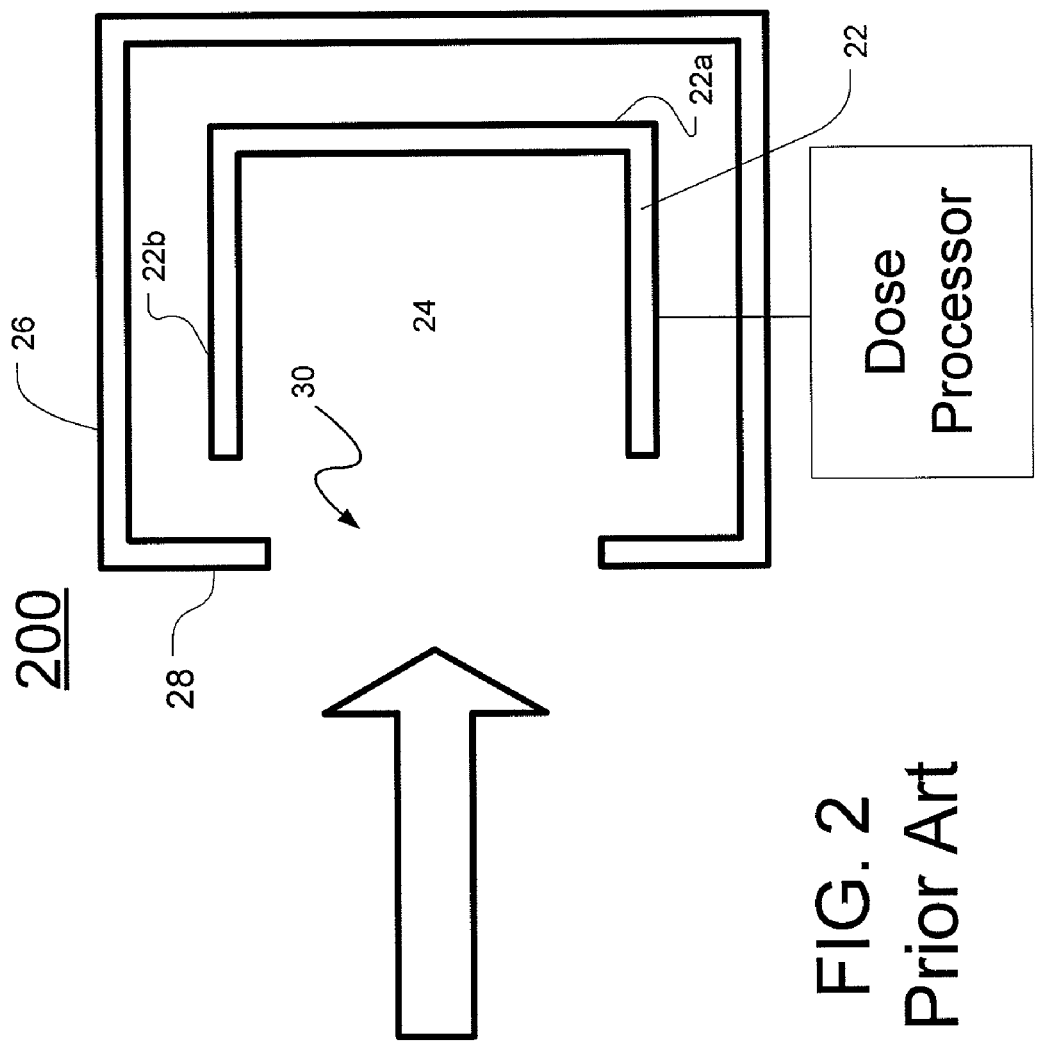
FIG. 2 is a block diagram illustrating a conventional Faraday cup.

In the present disclosure, several embodiments of an apparatus for measuring beam characteristics are introduced. For illustrative purpose, the disclosure is made in context to a beam-line ion implantation system. However, those in the art will recognize that the present disclosure may be equally applicable to other processing systems including, for example, a plasma immersion ion implantation system ("PIII"), a plasma doping ("PLAD") system, and a particle etching system. In addition, the present disclosure may be equally applicable to other processes including, for example, laser process.

For purpose of clarity, the disclosure is made in context to a term "beam." The term may refer to a beam comprising a plurality of particles or beamlets. The beam may also refer to a coherent, substantially non-diverging electromagnetic radiation comprising a plurality of particle-like photons. Meanwhile, the particles may refer to photons, or charged or neutral subatomic, atomic, or molecular particles. Such particles may originate from a particle generator such as, for example, a laser, a maser, an ion source of the beam-line ion implantation system, and plasma or gas that contains the particles.

The present disclosure is also made in context of a term "target." The term denotes a final destination of particles including, but not limited to, a substrate being processed or a particle dump. The target may be made of a metal, an insulator, a semiconductor, or a combination thereof. Further, the disclosure includes the term "substrate plane" to exemplify a theoretical plane where the beam is intended to be incident on a substrate.

Referring to FIG. 3, there is shown a cross sectional side view of an exemplary beam characteristic detecting system 300, according to one embodiment of the present disclosure. In FIG. 3a, a cross sectional plan view of the detecting system 300 is illustrated. As illustrated in FIGS. 3a and 3b, the detecting system 300 may comprise a body 302 defining a cavity 304; an entrance aperture 308 disposed at a first end of the body 302 for receiving a plurality of particles 306; and one or more detectors 312 for detecting the particles 306. The entrance aperture 308 may be defined by the body 302 of the detecting system 300. The entrance aperture 308 may also be defined by a plate 310 with an opening proximate to the first end.

The detecting system 300 may optionally comprise an exit aperture 314 disposed at a second end, opposite to the entrance aperture 308. Alternatively, the detecting system 300 may comprise a second wall 302a disposed at the second end, as shown by the dotted line 302a, and the exit aperture 314 may be absent. Yet in another example, the second wall 302a may have an aperture defining the exit aperture 314 such that detecting system 300 may have the second wall 302a and somewhat smaller exit aperture 314. Although the present disclosure also contemplates detecting systems without an exit aperture 314, the disclosure will focus on the detecting systems containing the exit aperture 314 for purpose of clarity.

Behind the exit aperture 314, a particle target 318 may be disposed for receiving the particles 306 exiting the system 300. Another particle detector (not shown) may also be disposed behind the exit aperture 314 for detecting at least a portion of the exiting particles 306.

Proximate to the detecting system 300, a process control 313 may be disposed for receiving a signal representative of the detected particles 306. In the present disclosure, the detector 312, the body 302, or both may detect the particles 306 and send a signal representative of the detected particles 306 to the process control 313. If present, the second wall 302a may also detect the particles 306 and send the signal. In receiving the signal, the process control 313 may identify the source of the signal and determine the amount of detected particles by each of the detector 312, the body 302, and/or the second wall 302a.

The detector 312 contained in the cavity 304 of the body 302 for detecting the particles 306 may be a single detector 312. However, it is also contemplated that the detecting system 300 may comprise a plurality of detectors 312 in the cavity 304. One or more detectors 312 may contain and/or define one or more channels 316 through which the particles 306 may pass from the entrance aperture 308 to the exit aperture 314. Each channel 316 may have a predetermined length along the x axis and a predetermined width along the y axis, thus a predetermined aspect ratio. In addition, each channel 316 may have a predetermined height along the z axis. Further, each channel 316 may have circular or any other polygonal cross section, including, for example, a quadrilateral cross section.

Depending on the aspect ratio of the channels 316 and the angle of the particles 306 directed to the system 300, the particles 306 may either pass through the channels 316 or be incident on the detector 312 and detected. To detect the incident particles 306, the detector 312 may contain a metal, an insulator, a semiconductor, or a combination thereof. For example, the detector 312 may contain photodetector that may detect photons or a thermal sensor to detect neutral particles. Each surface 312a, 312b, 312c, and 312d of the detector 312 may independently detect the particles and determine the amount of particles incident on each surface 312a, 312b, 312c, and 312d.

The detecting system 300 of the present disclosure may be mobile. For example, the detecting system 300 may have a degree of rotational freedom about the x axis, as shown by arrow 352. In addition, the system 300 may have at least one degree of translational freedom.

In operation, a particle beam comprising a plurality of the particles 306 may be directed to the detecting system 300 along a beam direction and a beam angle. Although the present disclosure also contemplates a converging beam and a diverging beam, the disclosure will focus on a ribbon beam having a quadrilateral cross section. In the ribbon beam, majority of the particles 306 may travel in a substantially parallel manner along the direction of the beam, at the beam angle. However, a small number of the particles 306 may deviate, albeit slightly, from the direction and angle.

If the ribbon beam of multiple particle angles is aligned with the channels 316, thus within the channels' aspect ratio, a large number of particles 306 may travel through the channels 316 and exit the detecting system 300. However, the particles 306 deviating from the beam direction and angle may be misaligned and incident on the detector 312 or the body 302. The detector 312 and the body 302 may measure the amount of incident particles 306, generate a signal representative of the measured amount (e.g. incident particle dose), and send the signal to the process control 313. Based on the signal, the beam characteristics may be assessed, and the beam may be adjusted to the required specification.

If desired, the system 300 may be translated to other locations, and the characteristics of different regions of the beam may be determined. The system 300 may be translatable across the beam in one or more transverse directions, and the transverse directions may be orthogonal or perpendicular to the beam. In addition, the transverse directions may be non-orthogonal or non-perpendicular to the beam. Further, the transverse directions may be parallel or non-parallel to the substrate plane. If translation of the detection system 300, however, is not desired, several detecting systems 300 may be disposed in an array to assess the characteristics of different sections of the beam.

In addition to being translatable, the system 300 may also be rotatable. The system 300 may be rotated about the x-axis, and the system 300 may measure the beam characteristics as the system 300 is being rotated. The angle of rotation about the x-axis may preferably be about 90 degrees. However, it is contemplated that the angle of rotation may be anywhere from 0 to 360 degrees.

Figure 4:
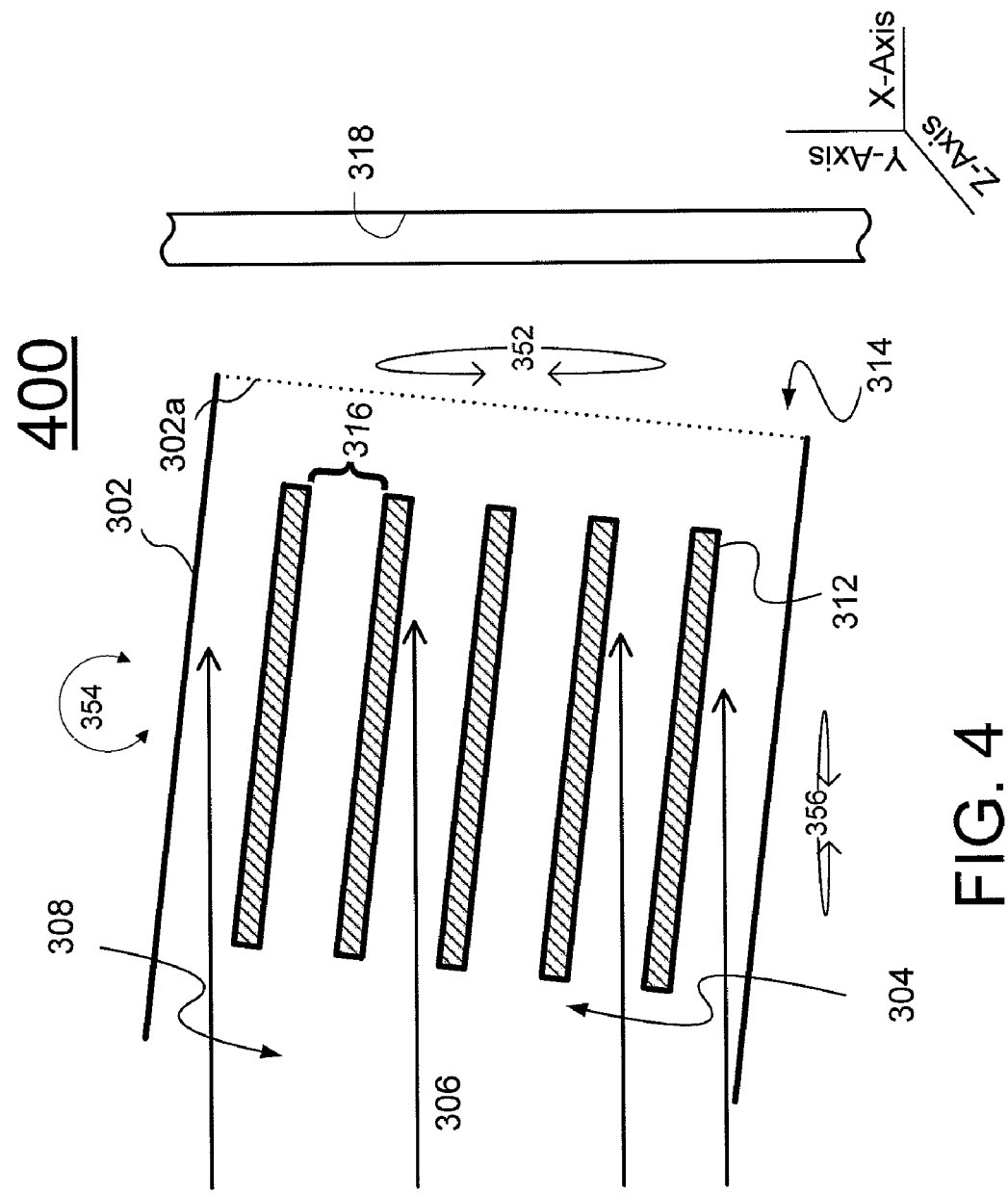
FIG. 4 is a block diagram illustrating an apparatus for measuring particle beam characteristics according to another embodiment of the present disclosure.

Referring to FIG. 4, there is shown a cross sectional side view of another exemplary beam characteristic detecting system 400 according to another embodiment of the present disclosure. As illustrated in FIG. 4, the detecting system 400 of the present embodiment may be analogous to the detecting system 300 shown in FIG. 3, and comprise all components and features of the detecting system 300 illustrated in FIG. 3. As such, the description of the system 400 will focus on components and features that may have not been described with earlier embodiments.

In the present embodiment, the detecting system 400 may comprise at least one additional degree of rotational freedom. For example, the detecting system 400 may be rotatable at least about the x-axis, analogous to the system 300. In addition, the detecting system 400 may be rotatable at least about the z-axis, as shown by arrow 354. The detecting system 400 may also be rotatable about the y-axis, as shown by arrow 356. Rotating the system 400 about the z-axis may enable the system 400 to measure the beam characteristics including, for example, a vertical particle angle distribution in the ribbon beam. Meanwhile, rotating the system 400 about the y-axis may enable the system 400 to measure characteristics including, for example, a horizontal particle angle distribution. In another embodiment, the detector 312 contained in the system 400 may also be rotatable about x, y, and/or z axes independent of the system body 302. As such, the detecting system 400 and/or the detector 312 may be rotatable with respect to the particle beam or other beam-line components (e.g. extraction electrodes, a 90° magnet analyzer, deceleration stages, and a 70° magnet collimator 110 etc. . . . ). In the present disclosure, the particle beam may be a fixed beam. Alternatively, the beam may be non-fixed, and the direction or path of the beam may be changed. The detecting system 400 may also be rotatable with respect to the target 318, whether the target 418 is disposed near the exit aperture 314, near a side of the system's body 302, or near the entrance aperture 306. It is also contemplated that in some embodiment, the target 318 may be rotatable along with the detecting system 400.

The center of each rotation, in the present disclosure, may be located at a single point or different points. It is contemplated that the center of each rotation may be located at the center of the detecting system 400 or other portion/portions of the system 400. It is also contemplated that the center of each rotation may be located at one or more points removed from the system 400.

If the ribbon beam directed to the detecting system 400 is aligned with the channels 312, majority of the particles 306 may travel through the channels 316 and exit the detecting system 400. As such, the detecting system 400 may be substantially transparent (i.e. a maximum transparency state) to the particles and only a minimum amount of the particles 306 may be detected. The particles 306 that are detected may include those deviating from the beam direction and angle. During the maximum transparency state, the detecting system 400 may measure beam characteristics such as, for example, the beam direction, angle, and parallelism. The detecting system 400 may also have a minimum transparency state when the detecting system 400 is rotated about the z-axis. Such a state may also be achieved by rotating the detector 312, if the detector 312 is independently rotatable. During the minimum transparency state, the beam and the channels 316 may be misaligned and incident on the detector 311 and/or the body 302, and the systems 400 may measure the beam intensity or particle dose.

Between the minimum and maximum transparency states, the detecting system 400 may be in an intermediate transparency state. In the present disclosure, the intermediate transparency state may be a single fixed state or a series of transitional states between the minimum and maximum transparency states. The detecting system 400 in the intermediate transparency state may measure an angle distribution of the particles 306 in the ribbon beam. By measuring the particles 306 incident on the detector 312 as the system is rotated about the z-axis, and as the transparency state of the system 400 is changed from the minimum to maximum transparency state, a vertical angle distribution of the particles 306 may be determined. If desired, a horizontal angle distribution of the particles may also be determined. For example, the system 400 may measure the particles incident on the detector 412 as the system 400 is rotated about the y-axis and as the transparency state of the system 400 is changed from the minimum to maximum transparency states.

In some embodiments, the detector 312 of the system 400 may be structured such that the system 400 is capable of measuring only one of vertical and horizontal angle distribution. In such embodiments, the detecting system 400 may also be rotated about the x-axis for about 90 degrees. Thereafter, the system 400 may be rotated about one of y and z axes and measure the other one of vertical and horizontal particle angle distribution. In some other embodiments, the system 400 may be rotated about the x-axis at other angles such that particle distributions along other directions, the distributions other than vertical and horizontal particle angle distributions, may also be measured.

Preferably, the detecting system 400 may be in a minimum transparency state to measure the particle dose when the substrate is being processed. If the measurement of other characteristics, such as the beam direction, the angle, the parallelism, and the angle distribution are necessary, the detecting system 400 or the detector 312 may be rotated about x, y, and/or z axis.

Referring to FIG. 5a, there is shown a cross sectional side view of an exemplary beam intensity and angle detecting system 500 according to another embodiment of the present disclosure. FIG. 5b shows a front view of the system 500. As illustrated in FIGS. 5a and 5b, the detecting system 500 of the present embodiment may be analogous to the detecting systems 300 and 400 shown in FIGS. 3 and 4. The description of the system 500 may, therefore, focus on components and features that may have not been described with earlier embodiments.

In the present embodiment, the detecting system 500 may comprise a detector 512 including vertical portions 512a and horizontal portions 512b and defining a honeycomb structure. With such a structure, the detector 512 may define a plurality of cellular channels 516. The vertical portions 512a may be, for example, perpendicular to the horizontal portions 512b to define rectangular cellular channels 516. However, it is also contemplated that the portions 512a and 512b may be spaced apart from one another at other angles. It is also contemplated that each cellular channel 516 may have a variety of cross section, including, for example, circular, triangular, and quadrilateral cross section.

The system 500 of the present embodiment may have the rotational freedom about x, y, and z axes. The system 500 may be rotatable about the z-axis to achieve first minimum, intermediate, and maximum transparency states. In addition, the system 500 may be rotatable about y-axis to achieve second minimum, intermediate, and maximum transparency states. The rotation of the system 500 about the z-axis to achieve different first transparency states may enable the system 500 to measure beam characteristics such as, for example, the beam direction, angle, parallelism, intensity or particle dose, and vertical particle angle distribution. Meanwhile, the rotation of the system 500 about the y-axis to achieve different second transparency states may enable the system 500 to measure, among others, the horizontal particle angle distribution.

Figure 6A:
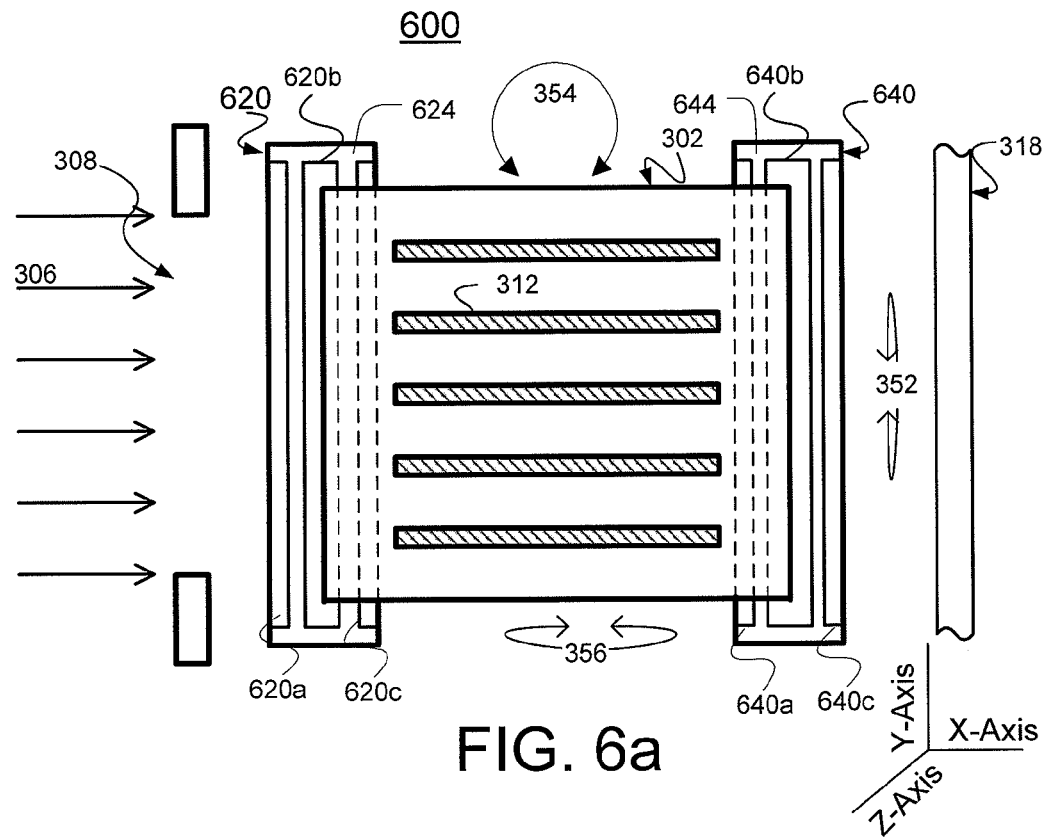
FIGS. 6a, 6b, and 6c are block diagrams illustrating an apparatus for measuring particle beam characteristics according to another embodiment of the present disclosure.

Referring to FIG. 6a, there is shown a cross sectional side view of an exemplary particle intensity and angle detecting system 600 according to another embodiment of the present disclosure. In the present embodiment, the detecting system 600 may be analogous to the detecting system 300, 400, and 500 described above. For example, the detecting system 600 may also comprise one or more detectors 312, defining or containing a plurality of channels 616. In the present embodiment, the detector 312 and channels 316 may have structures analogous to those of the systems 300 and 400, or those of the system 500. In addition, the detecting system 600 may also have one or more degrees of translational and rotational freedom. Hereinafter, the description of the present embodiment may focus on components and features that may not have been described in previous embodiments.

The detecting system 600 may include a first suppression assembly 620 proximate to the entrance aperture 308. If the detecting system 600 contains the exit aperture 314, the detecting system 600 may also comprise a second field suppression assembly 640 disposed proximate to the exit aperture 314.

Figure 6B:
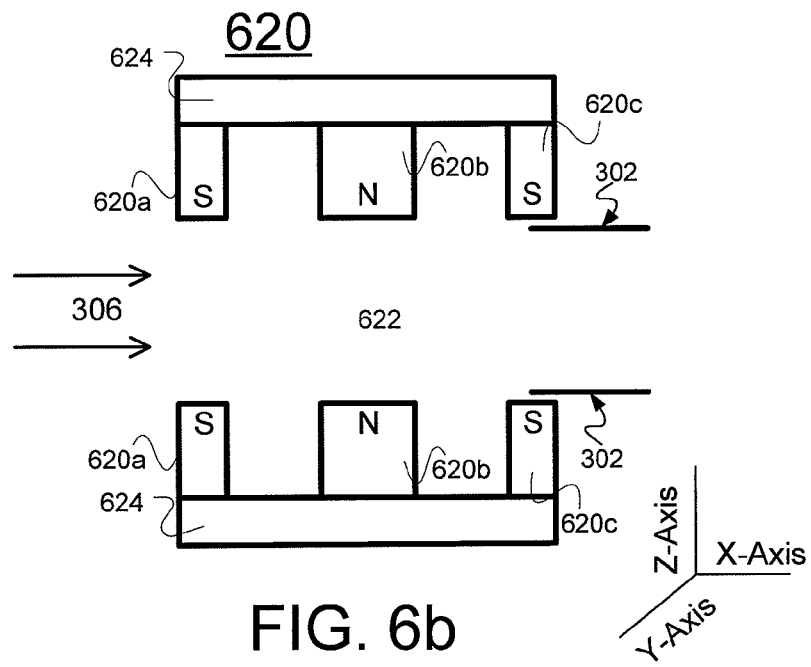

Referring to FIG. 6b, the first suppression assemblies 620 may include a first gap 622 through which particles 306 may pass through the first assembly 620. The first field suppression assemblies 620 may also comprise a plurality of laterally disposed field members 620a, 620b, and 620c. Although each of the laterally disposed field members 620a, 620b, and 620c may be a single piece, it is also contemplated that each field member 620a, 620b, and 620c, may be a plurality of pieces disposed orthogonally with respect to the first gap 622 (e.g. along the y-axis). In the present embodiment, the length of second field member 620b along the x axis may be twice the length of each of the first and third members 620a and 620c. However, it is also contemplated that each member 620a, 620b, and 620c may have other lengths, the lengths being equal or unequal. Further, the field members 620, 620b, and 620c may be coupled to one another by a first conducting member 624 such as, for example, steel.

In the present embodiment, the second field suppression assembly 640 may be similar to the first assembly 620. In particular, the second suppression assemblies 640 may also include a second gap 642; a plurality of laterally disposed field members 640a, 640b, and 640c of the second assembly 640; and a second conducting member 644. As the first and second field suppression assemblies 620 and 640 may be similar, the description of the second assembly 640 will not be provided. Instead, the description of the system 600 will focus on the first assembly 620.

In the present embodiment, the field members 620a, 620b, and 620c of the first assembly 620 may be arranged such that alternate polarities are proximate to the gap 622. For example, if the field members 620a, 620b, and 620c comprise magnet members, the polarity of the first and third members 620a and 620c proximate to the gap may be S polarity, whereas the polarity of the second member 620b proximate to the gap may be N polarity. However, it is also contemplated that the polarity of the first and third members 620a and 620c proximate to the gap may be N polarity, whereas the polarity of the second member 620b proximate to the gap may be S polarity.

In operation, the ribbon beam may be directed to the detecting system 600. The particles 306 of the beam may enter the first field suppression assembly 620 and pass through the field members 620a, 620b, and 620c via the first gap 622. The particles 306 may then pass through to the body 302. If the system is in a state other than the minimum transparency state, at least a portion of the particles 306 may pass through the system body 302. The particles 306 passing through the system 600 may then pass through the exit aperture 314 and the second field suppression assembly 640, if both are present.

Figure 6C:
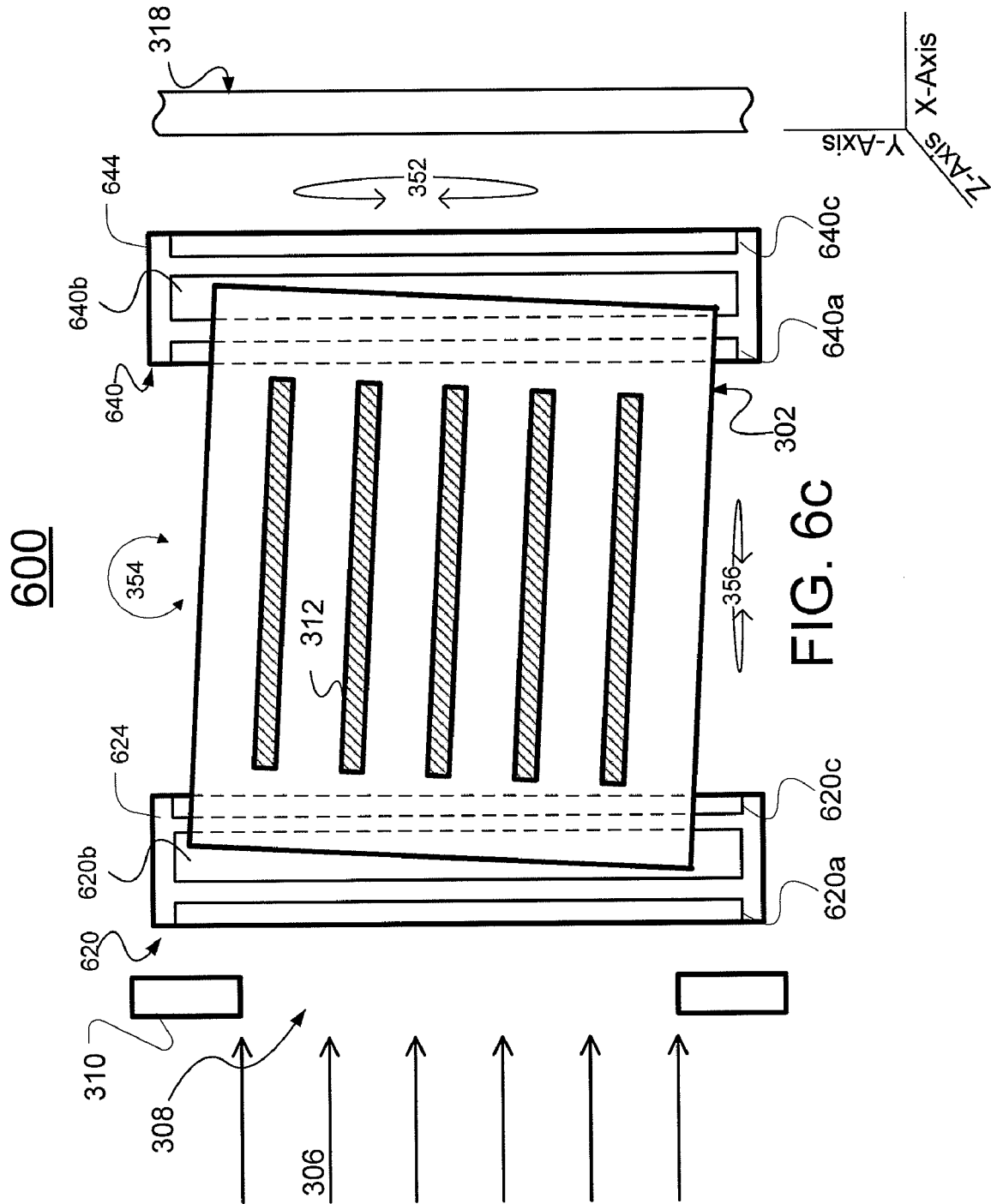

Analogous to the systems 300 described above, the detecting system 600 may be rotatable about the x axis. In addition the system 600 of the present embodiment may be rotatable about the y and z axes analogous to the systems 400 and 500. As such, the system 600 may have the first minimum, intermediate, and maximum transmission states, and/or the second minimum, intermediate, and maximum transmission states. If the system 600 of the present embodiment is rotated about the x, y, and z axes, the system body 302 may be rotated independently of the first and second field suppression assemblies 620 and 640 (FIG. 6c). Alternatively, the first and second field suppression assemblies 620 and 640 may be rotated along with the system body 302.

By disposing the first and second field suppression assemblies 620 and 640, the detecting system 600 may limit the effect of secondary electrons. The secondary electrons may be generated when energetic particles, including photons, collide with a solid material. By disposing the second field suppression assembly 640 near the exit aperture 314, the detecting system 600 may prevent the secondary electrons generated outside of the detecting system 600 (e.g. by collision of the particles 306 and the target 318) from entering the detecting system 600 and being collected. In addition, the second field suppression assembly 640 may prevent any secondary electrons generated within the system 600 from escaping via the exit aperture 314. Likewise, the first field suppression assembly 620 may prevent the secondary electrons outside of the system 600 from entering via the entrance aperture 308 and prevent the secondary electrons generated within the system 600 from escaping via the entrance aperture 308.

Another advantage of the field suppression assemblies 620 and 640 may be found in the angle measurement of the charged particle beam such as, for example, the ion beam. In a conventional magnetic suppression system, a particle passing through the suppression system, if charged, may be deflected or displaced by the magnetic field generated by the magnets of the suppression system and acquire a net deflection or displacement. If the particle is deflected toward a direction where the angle measurement is sensitive, the angle of the particle beam may not be measured correctly. Moreover, if the particle is displaced by a sufficient amount, it may not be possible to capture it with the system or the detector. It is not always possible to configure the magnetic deflection such that the detector measuring the angle is insensitive to the deflection or displacement.

The detecting system 600, however, may minimize, if not eliminate, the net deflection and displacement. By alternately disposing the members of opposite polarities in the path of the particle, the detecting system 600 may compensate the effect of different polarities and may prevent the charged particles passing through two opposite sets of polarities from acquiring the net deflection. In the process, the detecting system 600 may measure the beam characteristics such as the angle, the intensity or dose, and the angle distribution of the charged particles, with much accuracy.

Figure 7:
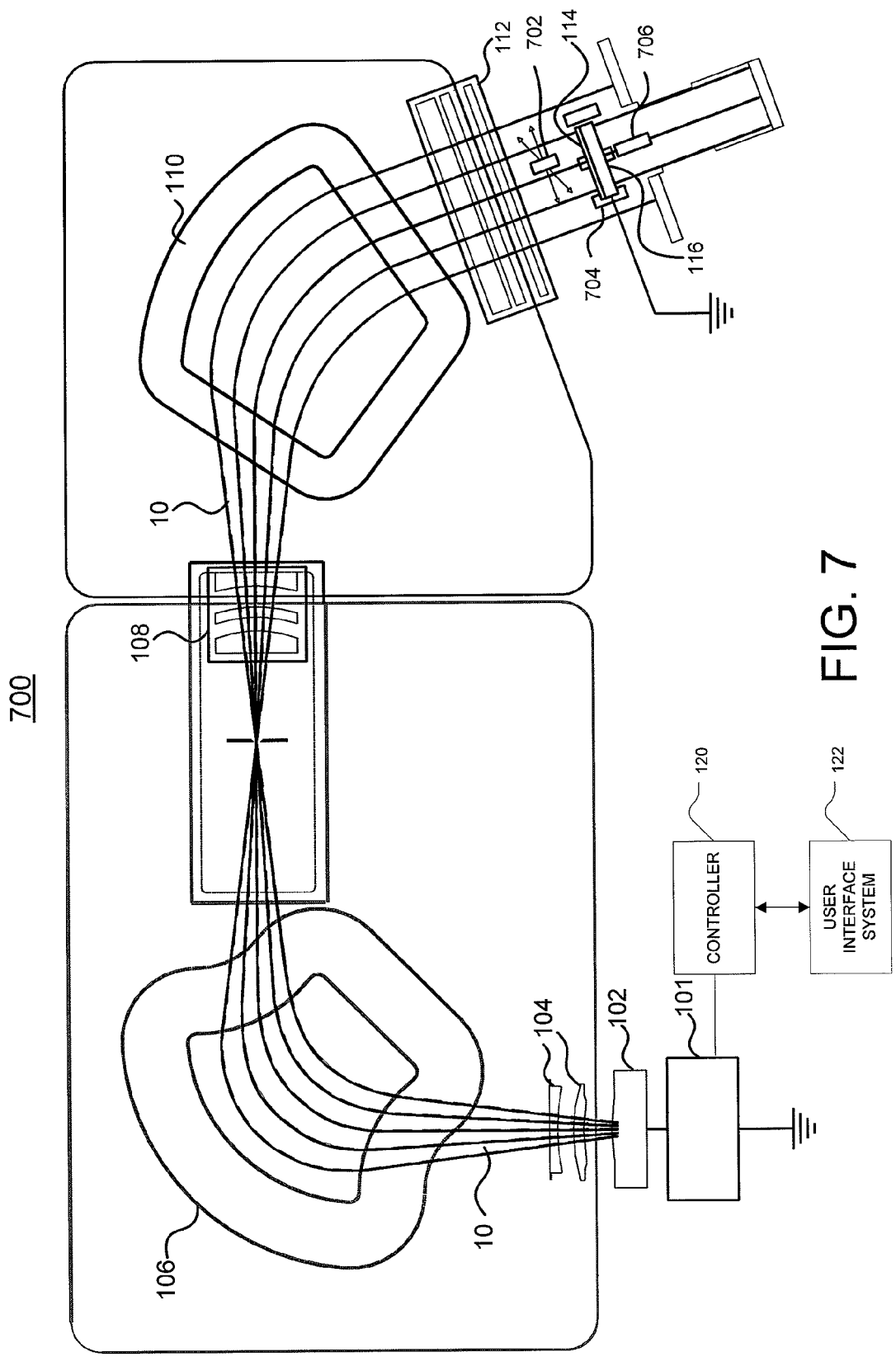
FIG. 7 is a block diagram illustrating an ion implanter incorporating the apparatus for measuring particle beam characteristics according to another embodiment of the present disclosure.

Referring to FIG. 7, there is shown a block diagram of an ion implanter 700 according to one embodiment of the present disclosure. As noted earlier, the disclosure is made in context to an ion implanter for illustration purposes, and the present disclosure may be equally applicable to other systems. The ion implanter of the present disclosure may include an ion source 102; the extraction electrodes 104; the 90° magnet analyzer 106; the first deceleration (D1) stage 108; the 70° magnet collimator 110; and the second deceleration (D2) stage 112; and the roplat 116. In addition, the implanter may comprise a platen 116 supporting a substrate 114 disposed on a substrate plane.

The ion implantation system 700 may also comprise at least one of first to third beam detecting systems 702, 704, and 706. If present, the first detecting system 702 may be disposed in front of the substrate plane; the second detecting system 704 may be disposed on or near the substrate plane; and the third detecting system 706 may be disposed behind the substrate plane. If present, there may be one or more first detecting systems 702, one or more second detecting systems 704, and one or more third detecting systems 706. Herein, the description will focus on the ion implanter 700 comprising at least one first detecting system 702, at least one second detecting system 704, and at least one third detecting system 706.

Each detecting system 702, 704, and 706 may be analogous to any one of the detecting systems 300, 400, 500, and 600 described earlier. For example, each of the detecting systems 702, 704, and 706 may also have one or more detectors (not shown) in the cavity of the system body 302. In addition, each of the detecting system 702, 704, and 706 may also have one or more field suppression assemblies. Each of the detecting systems 702, 704, and 706 may also have one or more degrees of translational and rotational freedom. Further, each detection system 702, 704, and 706 may itself comprise more than one detector in an array.

In operation, a particle beam 10 may be generated and directed toward the detecting systems 702, 704, and 706. Each of the detecting systems 702, 704, and 706 may be in a minimum transparency state, and the detecting systems 702 and 704 and 706 may determine the particle dose.

The detecting systems 702, 704, and 706 may determine other beam characteristics, such as the beam angle or the beam parallelism. For example, the beam may be directed to the first detecting system 702, which may be stationary or mobile and which may be in less than maximum transparency state. If mobile, the first detecting system 702 may move across the beam path. Stationary or mobile, the first detecting system 702 may block a portion of the particle beam and generate a shadow. The shadow may be detected by the fixed or mobile second and/or third detecting systems 704 and 706. And based on the shadow, the beam intensity, angle, uniformity, and other characteristics may be determined. A detailed description of the method of measuring the beam characteristics based on the beam shadow may be found in U.S. Pat. No. 6,791,094, which, in its entirety, is incorporated by reference.

The beam angle, parallelism, and angle distribution of the particles may also be determined by detecting the particles 306 as the transparency state of any one of the detecting systems 702, 704, and 706 is changed from the first minimum to maximum transparency states and/or second minimum to maximum transparency states. If multiple detecting systems 702, 704, and 706 are disposed at different locations, or if any one of the detecting systems 702, 704, and 706 translates across the beam, the beam uniformity and other characteristics at different locations may also be determined. If the characteristics of the beam do not conform to the required specification, the beam may be adjusted.

In the present disclosure, the ion implantation process may preferably be performed to the substrate after determining the beam characteristics and correcting any insufficiencies. However, it is also contemplated that the determination of the beam characteristics and the substrate processing may be performed simultaneously. For example, the beam characteristics may be monitored during the implantation process to ensure that the characteristics do not deviate from the required specification.

Figure 8:
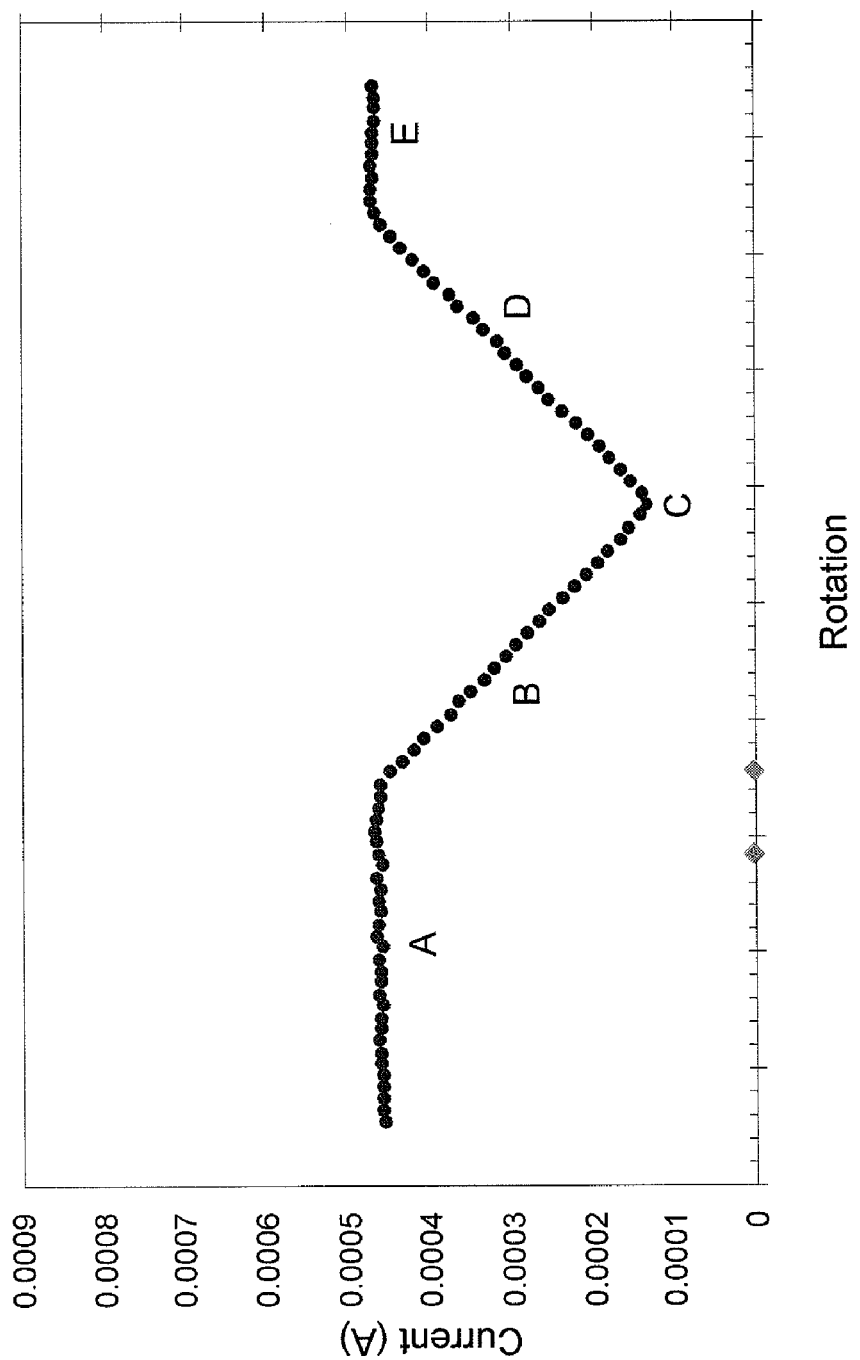
FIG. 8 illustrates particle beam characteristic measured by the apparatus of the present disclosure.

Referring to FIG. 8, there is shown a graph illustrating beam characteristics measured by the detecting system of the present disclosure, as the system is rotated or tilted about an axis from minimum transparency state to maximum transparency state. In the present embodiment, the detecting system may be one of systems 400, 500, 600, 702, 704, and 706, described above. The rotation, meanwhile, may be one of y and z axes. Further, the beam may be an ion ribbon beam. However, other types of beam may be equally applicable and contemplated.

Hereinafter, the description of FIG. 8 is provided in conjunction with the operation of the detecting system of the present disclosure. Initially, the detecting system may be in a primary minimum transparency state, as represented by region A. Thereafter, the detecting system may be rotated about one of y and z axes to a primary intermediate transparency state, as represented by region B. The detecting system may continue to rotate to the maximum transparency state, as represented by region C, where only a small portion of the particles are detected. Thereafter, the system may continue to rotate in the same direction to achieve a secondary intermediate transparency state, as represented by region D, and a secondary minimum transparency state, as represented by region E. Alternatively, the system may rotate in an opposite direction to return to the primary intermediate and minimum transparency states. As noted earlier, the detecting system of the present disclosure may detect the particles as it is rotated or translated.

The measurement shown in FIG. 8 may provide much information about the beam. For example, the current in regions A and E, the amount of particles detected during the minimum transparency states may represent the particle dose. Meanwhile, the slope of regions B and D may represent the particle angle distribution. If the system is rotated about the z-axis, the slope of two regions may represent the vertical angle distribution. However, if the system is rotated about the y-axis, the slope of regions B and D may represent the horizontal angle distribution. If the structure of the detector of the detecting system such that the system is capable of detecting the particle angle distribution in only one of vertical and horizontal angle distributions, the system may be rotated, for example, 90 degrees about the x axis. Thereafter, the system may measure the other one of the vertical and horizontal angle distributions. As noted earlier, additional beam characteristics such as, for example, beam parallelism, may also be obtained from the measurement.

Several embodiments of apparatus and method for detecting particle beam characteristics are disclosed in the present disclosure. Those of the art will recognize that the present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. For example, the detecting system 600, 702, 704, and 706 may employ an electrostatic suppression arrangement to suppress both net deflection and net displacement of the particles. Alternatively, the systems described in the present disclosure may employ a software correction to account for the possible angle error. In another example, the detecting system of the present disclosure may initially be in the maximum transparency state and measure the beam characteristics as the system is rotated from the maximum to minimum transparency states. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method for measuring properties of a particle beam having a plurality of particles, the method comprising:
generating the particle beam and directing the particle beam along a beam path;
disposing at least one particle beam detecting system on at least a portion of the beam path to receive at least a portion of the generated particles, the particle beam detecting system comprising an entrance aperture, an exit aperture, and at least one detector defining a channel in communication with the entrance aperture and the exit aperture, and wherein at least one particle pass through the at least one particle beam detecting system via the entrance aperture, the channel and the exit aperture of the at least one particle beam detecting system;
rotating the particle beam detecting system from a first position to a second position during receiving the at least portion of the generated particles; and
detecting at least a portion of the received particles during the rotating with the at least one detector,
wherein less particles pass through the at least one particle beam detecting system, via the exit aperture, during the first position than during the second position, and wherein more particles are detected by the detector of the particle beam detecting system during the second position than by the detector during the first position.

2. The method according to claim 1, wherein the particle beam detecting system further comprises:
a body defining a cavity wherein the detector is disposed in the cavity;
a first field suppressor proximate to the entrance aperture; and
a second field suppressor proximate to the exit aperture.

3. The method according to claim 2, further comprising:
rotating the detector relative to the first and second field suppressors.

4. The method according to claim 2, further comprising:
rotating the detector with the first and second field suppressors.

5. The method according to claim 2, further comprising preventing particles passing the first and second field suppressors from acquiring a net displacement.

6. The method according to claim 2, wherein the rotating comprises rotating the particle beam detecting system relative to the beam.

7. The method according to claim 1, further comprising determining at least one of a particle dose, a particle beam parallelism, and an angle distribution of the particles in the particle beam.

8. The method according to claim 1, wherein the particle beam detecting system further comprises a body defining a cavity in which the detector is disposed.

9. The method according to claim 8, wherein the rotating the particle beam detecting system comprises rotating the detector relative to the body.

10. The method according to claim 1, further comprising:
disposing a substrate on at least a portion of the beam path downstream of the particle beam detecting system; and
directing the particles that pass through the particle beam detecting system toward the substrate.

11. A method for measuring properties of a particle beam having a plurality of particles, the method comprising:
generating the particle beam and directing the particle beam along a beam path;
disposing at least one particle beam detecting system on at least a portion of the beam path to receive at least a portion of the generated particles, the particle beam detecting system comprising an entrance aperture an exit aperture disposed at opposite sides of the body, and at least one detector defining a channel that is in communication with the entrance aperture and the exit aperture of the at least one particle beam detecting system;
rotating the at least one particle beam detecting system from a maximum transparency state to a minimum transparency state while receiving the at least portion of the generated particles; and
detecting at least a portion of the received particles during the rotating the particle beam detecting system from the maximum transparency state to the minimum transparency state with the at least one detector, wherein more particles pass through the at least one particle beam detecting system via the exit aperture during the maximum transparency state than during the minimum transparency state, and wherein less particles are detected during the maximum transparency state than during the minimum transparency state.

12. The method according to claim 11, wherein the particle beam detecting system further comprises:
a first field suppressor proximate to the entrance aperture; and
a second field suppressor proximate to the exit aperture.

13. The method according to claim 12, further comprising preventing particles passing the first and second field suppressors from acquiring a net displacement.

14. The method according to claim 12, further comprising:
rotating the detector relative to the first and second field suppressors.

15. The method according to claim 12, further comprising:
rotating the detector with the first and second field suppressors.

16. The method according to claim 11, wherein the rotating comprises rotating the particle beam detecting system relative to the beam.

17. The method according to claim 11, further comprising determining at least one of a particle dose, a particle beam parallelism, and an angle distribution of the particles in the particle beam.

18. The method according to claim 11, wherein the particle beam detecting system further comprises a body defining a cavity and wherein the least one detector is contained in the cavity.

19. The method according to claim 18, wherein the rotating the particle beam detecting system comprises rotating the detector relative to the body.

20. The method according to claim 11, further comprising:
disposing a substrate on at least a portion of the beam path downstream of the particle beam detecting system; and
directing the particles that pass through the particle beam detecting system toward the substrate.

* * * * *